(12) United States Patent
Wright

(10) Patent No.: US 8,575,550 B2
(45) Date of Patent: Nov. 5, 2013

(54) APPARATUS HAVING A SCREENED STRUCTURE FOR DETECTING THERMAL RADIATION

(75) Inventor: Jeffrey Wright, East Lothian (GB)

(73) Assignee: Pyreos Ltd., Edinburgh (GB)

( * ) Notice: Subject to any disclaimer, the term of this patent is extended or adjusted under 35 U.S.C. 154(b) by 508 days.

(21) Appl. No.: 12/808,745

(22) PCT Filed: Jul. 30, 2008

(86) PCT No.: PCT/EP2008/006289
§ 371 (c)(1),
(2), (4) Date: Sep. 27, 2010

(87) PCT Pub. No.: WO2009/077016
PCT Pub. Date: Jun. 25, 2009

(65) Prior Publication Data
US 2011/0024628 A1 Feb. 3, 2011

(30) Foreign Application Priority Data

Dec. 17, 2007 (DE) .......................... 10 2007 062 688

(51) Int. Cl.
*H01L 31/0203* (2006.01)
(52) U.S. Cl.
USPC ..................................................... 250/338.4
(58) Field of Classification Search
USPC .......................................... 250/338.3, 338.4
See application file for complete search history.

(56) References Cited

U.S. PATENT DOCUMENTS

2008/0164413 A1* 7/2008 Shibayama ................ 250/338.4
2010/0264311 A1* 10/2010 Giebeler et al. ........... 250/338.3

FOREIGN PATENT DOCUMENTS

| DE | 195 25 071 A1 | 1/1997 |
|---|---|---|
| DE | 100 04 216 A1 | 8/2001 |
| DE | 10 2004 002 163 A1 | 8/2005 |
| EP | 1 719 988 A1 | 11/2006 |
| GB | 2 133 615 A | 7/1984 |
| GB | 2 424 699 A | 10/2006 |
| JP | 04315018 A * | 11/1992 |
| JP | 09126883 A | 5/1997 |
| WO | WO 2006057191 A1 * | 6/2006 |

* cited by examiner

*Primary Examiner* — Constantine Hannaher
(74) *Attorney, Agent, or Firm* — Sughrue Mion, PLLC

(57) ABSTRACT

An apparatus for detecting radiation has a substrate, a protective housing fitting on the substrate, which has an electrically conductive material and a top facing away from the substrate, and that has an aperture therein. A stack is fitted on the substrate inside the protective housing and includes at least one detector substrate having at least one thermal detector element thereon that converts incoming thermal radiation into an electrical signal, at least one circuit carrier having at least one read circuit for reading out the electrical signal, and at least one cover that covers the detector element. The detector substrate is located between the circuit substrate and the cover. The detector substrate and the cover are arranged on each other such that the detector element of the detector substrate and the cover have at least one first stack cavity of the stack therebetween, the stack cavity being defined by the detector support and the cover. The circuit substrate and the detector substrate are arranged on each other such that the detector substrate and the circuit substrate have at least one second stack cavity therebetween, the second stack cavity being defined by the circuit substrate and the detector substrate. At least one of the first stack cavity and the second stack cavity is evacuated. The stack top that faces the substrate is accessible from outside of the protective housing.

14 Claims, 4 Drawing Sheets

APPARATUS HAVING A SCREENED STRUCTURE FOR DETECTING THERMAL RADIATION

BACKGROUND OF THE INVENTION

1. Field of the Invention

The invention concerns a device to detect thermal radiation with at least one shielded thermal detector element to transduce the thermal radiation into an electrical signal. In addition to the device a use of the device is specified.

2. Description of the Prior Art

A conventional device 300 for detection of thermal radiation is shown in FIG. 7. The device 300 has a substrate 310 and a sensor 320 that is attached to the substrate 310 by means of a casting compound 312. The device 300 also has a protective housing 330 that is arranged over the sensor 320 and attached to the substrate 310 by means of a hermetically sealed bonding connection 333. The protective housing 330 is dimensioned such that said protective housing 330 does not directly contact the sensor 320, such that an inner space 335 is fashioned between the sensor 320 and the protective housing 330. The protective housing 330 has a top side 332 that is arranged facing away from the sensor 320. A window opening 334 is provided in the top side 332, which window opening 334 is arranged above the sensor 320 so that light from outside the protective housing 330 can strike the sensor 320. A glass window 331 is placed hermetically sealed into the opening 334.

The protective housing 330 is made of metal, such that the sensor 320 is electromagnetically shielded from the protective housing 330. The glass window 331 is also inserted gas-tight into the window opening 334 and the bonding connection 333 is fashioned gas-tight, such that the inner space 335 is evacuated or charged with inert gas or, respectively, hydrogen. The sensor 320 is thereby protected from atmospheric influences. However, it is disadvantageous that the device 300 has a large space requirement due to the large structural height of the protective housing 330. Both the insertion and sealing of the glass window 331 in the window opening 334 and the fashioning of the hermetically sealed bonding connection 333 in the manufacture of the device 300 are also complicated and cost-intensive.

A device for detection of thermal radiation is described in DE 100 04 216 A1, for example. This device is designated as a pyrodetector. The detector element is a pyroelectric detector element. It has a layer structure with two electrode layers and a pyroelectric layer with pyroelectrically sensitive material arranged between the electrode layers. This material is lead zirconate titanate (PZT). For example, the electrodes consist of platinum or of a chromium-nickel alloy absorbing the thermal radiation. The thermal detector element is connected with a detector substrate made of silicon (silicon wafer). An insulation layer for electrical and thermal insulation of the detector element and the detector substrate from one another is arranged between said detector element and said detector substrate. The insulation layer has an evacuated cavity that extends across a base surface of the detector element, a support layer of the cavity and a cover of the support layer and the cavity. The support layer consists of polysilicon. The cover is made of a boron-phosphorus silicate glass (BPSG). A readout circuit is integrated into the detector substrate to read out, process and/or relay the electrical signal generated by the detector element. The readout circuit is realized via the CMOS (Complementary Metal Oxide Semiconductor) technique.

A device for detection of thermal radiation that is comparable to this is known from DE 195 25 071 A1. The thermal detector element is likewise a pyroelectric detector element as described above. The detector element is arranged on a multilayer detector substrate. The detector element is attached to a silicon layer of the detector substrate via one of its electrode layers. The silicon layer is located on an electrically insulating membrane of the detector substrate. For example, the membrane consists of $Si_3N_4/SiO_2/Si_3N_4$ triple layer. The membrane is in turn applied on a silicon substrate of the detector substrate. The silicon substrate has an exposure window (detection window) with a base surface that essentially corresponds to a base surface of the pyroelectric detector element. The exposure window is a cutout of the silicon substrate. Substrate material (silicon) of the substrate is thereby removed up to the membrane. The thermal radiation arrives at the detector element through the exposure window and there leads to an evaluable electrical signal. For this purpose, the membrane is characterized by a suitable transmission for the thermal radiation. A readout circuit for the electrical signal is integrated into the silicon layer, laterally offset from the detector element. The detector substrate also acts as a circuit substrate of the readout circuit.

In the known devices a number of detector elements can be present (detector element array). The electrical signal of each of the detector elements is thereby to be read out separately. For this the electrode layers of each of the detector elements are typically electrically contacted via bonding wires. However, this entails a significant space requirement for a wiring of the detector elements, with the result of a limited, relatively low detector element density (number of detector elements per surface segment of the detector substrate).

SUMMARY OF THE INVENTION

An object of the invention is to provide a device for detection of thermal radiation that exhibits a lower space requirement in comparison to the prior art and can be manufactured simply and cost-effectively.

To achieve the object, a device is specified for the detection of thermal radiation that has a substrate; a protective housing attached to the substrate and having an electrically conductive material. The protective housing has a top side facing away from the substrate, this top side having an opening therein. A stack is mounted on the substrate within the protective housing. This stack has at least one detector substrate with at least one thermal detector element to transduce the thermal radiation into an electrical signal, at least one circuit substrate with at least one readout circuit to read out the electrical signal, and at least one cover to cover the detector element. The detector substrate is arranged between the circuit substrate and the cover. The detector substrate and the cover are arranged on one another in such a way that at least one first stack cavity of the stack, that is defined by the detector substrate and the cover, is present between the detector element of the detector substrate and the cover. The circuit substrate and the detector substrate are arranged such that at least one second stack cavity of the stack that is defined by the circuit substrate and by the detector substrate is present between the detector substrate and the circuit substrate. The first stack cavity and/or the second stack cavity is/are evacuated or can be evacuated; and the stack has a stack top side facing away from the substrate. The stack top side of the stack engages with the opening so that the stack top side is accessible from outside the protective housing. According to the invention, the device is used in movement sensors, presence sensors and thermal imaging cameras.

The stack is realized as a compact, space-saving "sandwich" structure made of a detector substrate, circuit substrate and cover. The detector element is protected against damaging environmental influences by the cover. The environmental influence is, for example, dust, humidity or an etching chemical that would attack a component of the detector element or negatively affect the functionality of the detector element.

The protective housing is produced from electrically conductive material so that the stack is electromagnetically externally shielded by the protective housing. In that the stack is insensitive to harmful environmental influences due to its sandwich structure, the protective housing does not need to be set up such that it protects the stack from dust, humidity or an etching chemical, for example. The protective housing according to the invention is thus only provided with an opening in the top side with which the stack engages. The stack can either only dip into the opening (and thus only partially penetrate the opening), or can be inserted completely into the opening (and thereby terminate level with the outside of the top side of the protective housing), or can be pushed through the opening and thereby project outward on the outside of the top side of the protective housing.

The structural height of the protective housing is thereby essentially equal to the structural height of the stack, such that the structural height of the device is advantageously low. The stack also does not need to be hermetically sealed by the protective housing, whereby the protective housing can be simple in its execution. In the protective housing the opening is thus simply provided through which the stack is accessible from outside the protective housing, and the attachment of the protective housing on the substrate does not need to satisfy possible impermeability requirements.

The evaluation circuit can be integrated directly into the circuit substrate, for example via the CMOS technique. It is also possible for the circuit substrate to provide only one conductive path of the detector element. Via the conductor path the detector element is connected with an internal ASIC (Applied Specific Integrated Circuit) arranged in the circuit substrate or with an external ASIC. The external ASIC can be bonded. The external ASIC is advantageously contacted by means of the "flip-chip" technique (see below). The stack cavities ensure that the detector element is largely thermally decoupled from the circuit substrate and the cover.

The thermal radiation to be detected has a wavelength of over 1 µm. The wavelength is advantageously selected from the range from 5 to 15 µm. The thermal detector element is based on the Seebeck effect, for example. The thermal detector element is advantageously a pyroelectric detector element. As described above, the pyroelectric detector element consists of a pyroelectric layer with a pyroelectrically sensitive material and electrode layers mounted on both sides. The pyroelectrically sensitive material is, for example, a ceramic such as lithium niobate ($LiNbO_3$) or lead zirconate titanate. A ferroelectric polymer such as polyvinylidene fluoride (PVDF) is also conceivable. Platinum or a platinum alloy is considered as an electrode material of the electrode layers. A chromium-nickel electrode or an electrode made of an electrically conductive oxide is also conceivable. For example, the detector element possesses a rectangular footprint with an edge length of 25 µm to 200 µm.

Independently of the effect that is utilized to detect the thermal radiation, absorption of the thermal radiation by thermally sensitive material of the detector element that triggers the corresponding effect is necessary. The absorption ensues directly via the thermally sensitive material. However, it is also conceivable that the thermal radiation is absorbed by an electrode or electrode layer of the detector element. It is also additionally possible for the thermal radiation to be absorbed by an absorption subject in the immediate proximity of the detector element and a heat quantity that is thereby absorbed is emitted to the thermally sensitive material via convection or heat conduction. The absorption subject acts as an energy transmitter. For example, the absorption subject is applied directly to the detector element as a coating.

The stack of the device to detect the thermal radiation is advantageously designed such that the thermal radiation arrives directly on the detector element. For this purpose, in a particular embodiment the detector substrate, the circuit substrate and/or the cover possesses at least one exposure window with a specific transmission for the thermal radiation to expose the detector element with said thermal radiation. The exposure window is integrated into the cover, into the detector substrate and/or into the circuit substrate. The detector element and the exposure window are arranged on one another such that the exposure of the detector element ensues from a front side of the detector element facing away from the detector substrate (front side exposure) and/or from a back side of the detector element facing towards the detector element (back side exposure). The exposure window exhibits a specific transmission in the direction of the detection element. The transmission is optimally high and, for example, amounts to over 50% and in particular over 70% up to 95%.

Arbitrary materials come into consideration as materials of the detector substrate, the circuit substrate and the cover. Semiconductor materials (for example elementary germanium or various semiconductor compounds) are especially suitable due to the possibility of integration of electrical circuits or modules. According to a particular embodiment, the detector substrate, the circuit substrate and/or the cover possess silicon. A silicon substrate is respectively used as a cover, as a circuit substrate and as a detector substrate. Arbitrary structures and functionalities can be integrated into the substrates via the CMOS technique. Since silicon exhibits a low coefficient of absorption with regard to thermal radiation, the exposure window can additionally be very easily integrated into a silicon substrate: the silicon substrate itself forms the exposure window. With a suitable arrangement of the corresponding functionalities in the silicon substrate it is ensured that the thermal radiation arrives unhindered (thus without shadowing) on the detector element.

The transmission depends not only on the absorption coefficient of the material that the exposure window consists of. A thickness of the exposure window is also decisive. The exposure window is advantageously formed from a thinned region of the detector substrate or the circuit substrate. In a particular embodiment, the detector element is arranged opposite a circuit substrate recess of the circuit substrate or opposite a cover recess of the cover. The circuit substrate recess and the cover recess are respectively a region of the circuit substrate, or the cover, with relatively low thickness. In these regions the circuit substrate and the cover are thinned, for example via material removal. The recesses form the exposure window that is integrated into the circuit substrate or, respectively, into the cover and through which the thermal radiation arrives at the detector element. The detector element is advantageously spaced apart from the respective recess. The cover recess is a component of the first stack cavity between the detector substrate and the cover. The circuit substrate recess is a component of the second stack cavity between the detector substrate and the circuit substrate In a particular embodiment, the detector medium and the circuit medium and the cover are connected permanently with one another via an adhesive bond, and in particular via a hermetic adhesive bond. An adhesive bond is established for a permanent connection of the detector substrate and the circuit substrate and/or for a permanent connection of the detector substrate and the cover. The adhesive bond is designed such that the evacuable stack cavities are formed. Components of the stack that are located in the stack cavities (for example the detector element) are shielded from an environment by the hermetic adhesive bond. Therefore no material exchange with the environment occurs. The device thus can also be used in an aggressive environment. The stack cavities can be evacuated due to the hermetic adhesive bond. This increases the sensitivity to the thermal radiation to be detected.

The adhesive bonds between the detector substrate and the cover and between the detector substrate and the circuit substrate can be produced serially or simultaneously. The respective adhesive bond can be formed by an arbitrary material, for example an adhesive. It is particularly advantageous to simultaneously establish an electrical contact between the electrode layers of the detector element and the readout circuit with the adhesive bond. For this, in a particular embodiment the adhesive bond possesses an electrically conductive material. This in particular pertains to the adhesive bond between the circuit substrate and detector substrate. However, an adhesive bond with an electrically conductive material between the cover and the detector substrate can also be advantageous if wiring components for the detector element are integrated into the cover.

The technique known as the "flip-chip" technique is well suited for producing the adhesive bond. This technique is a mounting process from the field of mounting and connection engineering (AVT) that, above all else, has proven itself in microelectronics for the contacting of semiconductor microchips or integrated circuits in unhoused form. In the flip-chip technique a chip is mounted directly—without additional connection wires—with an active contacting side facing down towards the substrate (circuit substrate). A mounting ensues via structures known as "bumps" made of electrically conductive material. This leads to very long conductor lengths. This is utilized here; a more compact structure results. Due to the very short conductor lengths, additional unwanted leakage inductances and stray capacitances that interfere with the electrical signal to be read out are reduced to a minimum level. This effect in particular has an advantageous effect given a relatively small number of detector elements to be contacted. A number of electrical connections can additionally be established simultaneously with the aid of the flip-chip technique, which entails an enormous time (and therefore cost) savings.

Various techniques can be used to realize the "flip-chip" technique, and therefore to produce the adhesive bond. In a particular embodiment, a method selected from the group of gluing, soldering and/or bonding is implemented to produce the adhesive bond. Adhesive bonding or eutectic bonding is thereby conceivable. For soldering, bumps made of solder (solder balls) are applied on one or on both substrates or components of the device that are to be connected with one another. The cited methods are preferred over gluing since adhesives can outgas organic components (solvents, adhesive components . . . ). This in particular plays a role in light of the evacuation of the stack cavities. In spite of this, however, it can be necessary or advantageous to resort to gluing.

If gluing, various variants can be resorted to: the gluing can ensue with an electrically non-conductive adhesive. For this bumps are applied on contact surfaces of the corresponding substrate. The bumps consist of aluminum or gold, for example. An adhesive layer of the adhesive is subsequently applied to the substrate and the corresponding counterpart is arranged on the adhesive layer. The adhesive shrinks upon drying and the electrical contacts form.

An isotropically conductive adhesive can likewise be used for gluing. Conductive adhesive is applied on the contact surfaces of a substrate. The counterpart is subsequently placed with its contact surfaces on the adhesive points. The adhesive can be cured thermally or by means of UV radiation and thus produces the electrically conductive adhesive bond.

As an alternative to this, an anisotropically conductive adhesive is used. Anisotropically conductive adhesive is a compound material made of electrically non-conductive adhesive and electrically conducive particles contained therein with a low filling ratio. The anisotropically conductive adhesive is applied on the contact surfaces of the substrate. The electrically conductive particles are not in connection with one another after the application due to the low filling ratio. No electrically conductive connection forms. Given a placed counterpart, the electrically non-conductive adhesive is displaced until the particles are clamped between the contact surfaces of the substrate and the contact surfaces of the counterpart and an electrically conductive connection between the contact surfaces is created.

According to a particular embodiment of the method, the first stack cavity and/or the second stack cavity are evacuated during and/or after the fixed connection. For example, the production of the adhesive bond between the components of the stack ensues in vacuum. The stack cavity is evacuated with the formation of the adhesive bond. It is also conceivable that the stack cavities are initially established and evacuated afterward. It is also possible for the stack cavities to be evacuated in series or simultaneously. For a simultaneous evacuation, the stack cavities can be connected isobarically with one another. This means that the pressure in the two stack cavities is the same.

The device can possess a single detector element. However, with regard to the application of the device as a presence sensor, or in particular as a thermal imaging camera, it is advantageous or, respectively, necessary that multiple detector elements are present. In a particular embodiment, at least one detector array with multiple detector elements is therefore present. A detector element is thereby one pixel of the detector array. For example, the detector array is characterized by a columnar and/or linear arrangement of the detector elements. The detector elements are distributed one-dimensionally in a direction given a linear or columnar arrangement. A two-dimensional distribution exists given a columnar and linear arrangement. For example, the detector array consists of 240×320 individual elements. This corresponds to the relatively low resolution QVGA standard. Moreover, a random, planar distribution of the detector elements is also conceivable. A separate exposure window can be provided for each of the detector elements. However, it is advantageous that the device possesses a single exposure window for multiple or all detector elements. The production of the device can therefore be simplified.

According to a further embodiment, the stack possesses a casing. The stack is arranged in a casing. The casing protects the stack with its components from damaging environmental influences (for example humidity) or from mechanical destruction. It is thereby merely to be noted that the exposure of the detector element is not negatively affected by the casing. For this purpose, an exposure window with high transmission for the thermal radiation is integrated into the casing.

The casing can thereby be a housing made of an arbitrary material. The casing is advantageously a casting compound. For this a method selected from the group of injection molding methods or molding methods is implemented to arrange the casing. These methods are particularly advantageous for cost reasons. Unlinked or partially cross-linked (polymerized) plastic is thereby applied on the stack. After the application, the plastic is thermally induced or cured via exposure with UV light. For example, for integration of the exposure window a mask is used that is removed after the arrangement of the plastic or after the curing of the plastic. For example, this is achieved via transfer molding with an elastic insert. The use of an exposure window made of a material with high transmission for the thermal radiation that remains in the casing after the application an curing of the plastic is also conceivable.

It is preferable that the electrically conductive material of the protective housing possesses metal.

It is thereby advantageously achieved that the protective housing has a sufficient durability given advantageous manufacturing costs.

It is also preferred that the opening of the protective housing is fashioned such that the stack is fitted in the opening, and/or that the protective housing is constructed such that its top side terminates level with the top side of the stack.

The stack is thereby arranged countersunk in the opening so that the structural height of the device is advantageously low. The space requirement of the device is thus small. The stack is also arranged so as to be well accessible via the opening, such that the functionality of the device for detection of thermal radiation is high. Moreover, a gap that is provided due to design between the stack and the protective housing is advantageously small. The stack is thereby effectively protected and shielded by the protective housing.

The protective housing preferably has a base with which the protective housing is attached to the substrate. The connection between the base and the substrate advantageously only needs to be of a stable execution such that the connection satisfies typical strength requirements. A hermetically sealed execution of the connection is not necessary.

Moreover, it is preferred that the protective housing is arranged at a distance from the stack so that a cavity is fashioned inside the protective housing, between the protective housing and the stack. Additional electronic modules and electronic circuits could thereby be provided inside the protective housing, and thus be electromagnetically shielded in the inner space.

According to a further aspect of the invention, the device is used as a movement sensor, as a presence sensor or as a thermal imaging camera. A device with a single detector element can be sufficient for a movement sensor. The device can be equipped with multiple detector elements for a presence sensor. The device is equipped with a plurality of detector elements—for example 240×320 detector elements (QVGA standard) or more—for the thermal imaging camera. This is possible via the simple and space-saving wiring of the detector elements.

In summary, the following advantages of the invention are emphasized:

The device for detection of thermal radiation is compact.
The stack is electromagnetically shielded and well accessible from the outside.
Electronic modules and circuits can additionally be provided with electromagnetic shielding.
The manufacture of the device is simple and cost-effective since a hermetically sealed connection between the protective housing and the substrate does not need to be provided, and neither does a glass window need to be inserted, hermetically sealed, into the opening of the protective housing; nor does the inner space of the protective housing need to be evacuated or charged with inert gas.

DESCRIPTION OF THE PREFERRED EMBODIMENTS

Figure 1:
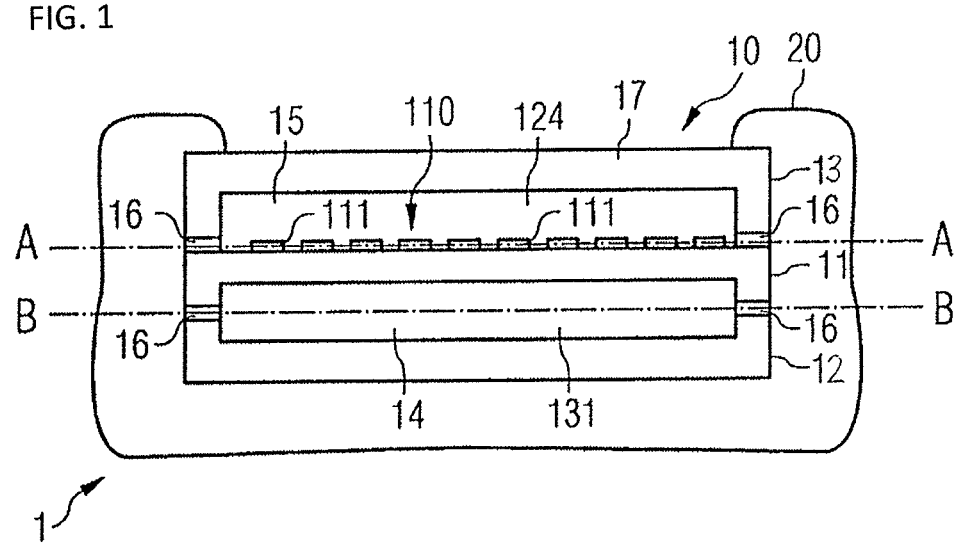
FIG. 1 shows a stack in accordance with the invention in a lateral cross section.
Figure 2:
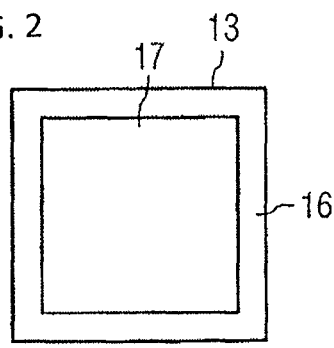
FIG. 2 shows the stack of FIG. 1 along the cross section surface B-B in a view of the cover.
Figure 3:
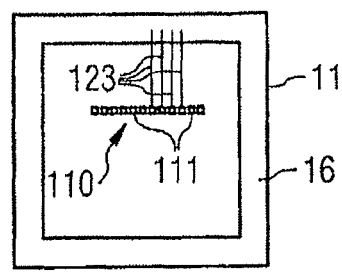
FIG. 3 shows the stack of FIG. 1 along the cross section surface A-A in a view of the detector substrate.
Figure 4:
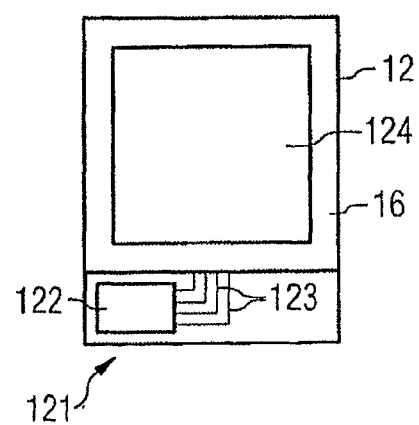
FIG. 4 shows the stack of FIG. 1 along the cross section surface A-A in a view of the circuit substrate.

As is apparent from FIGS. 1 through 6, a device for the detection of thermal radiation possesses a substrate 210 on which is arranged a stack 10. The stack 10 possesses a stack top side 225 facing away from the substrate 210 and is attached to the substrate 210 by means of a casting compound 20.

The device 1 also has a protective housing 220 in which the stack 10 is housed. The protective housing 220 is produced from metal so that the stack 10 is electromagnetically externally shielded by the protective housing 220.

The protective housing 220 has a top side 223 that is arranged facing away from the substrate 210. An opening 221 in which the stack 10 engages with its top side 225 is provided in the top side 223, such that the top side 223 of the protective housing 220 and the top side 225 of the stack 10 terminate level with one another.

The peripheral contour of the opening 221 is also fashioned such that, on the stack top side 225, the stack 10 is adjacent to the top side 223 of the protective housing 220, with a slight separation.

The protective housing 220 also has a base 222 facing away from the top side 225 and towards the substrate 210, which base 222 is fashioned as a flange. The base 222 is attached to the substrate 210 by means of a connection means, for example solder.

Inside the protective housing 220 an interior space 224 is provided around the stack 10, which interior space 224 is electromagnetically shielded by the protective housing 220.

The stack 10 is provided with a detector substrate 11 with a detector array 110 of thermal detector element 111 to transduce the thermal radiation into electrical signals; a circuit substrate 12 with a readout circuit 121 to read out the electrical signals; and at least one cover 13 to cover the detector elements; wherein the detector substrate and the cover are arranged on one another such that a first stack cavity 14 of the stack that is bounded by the detector substrate and by the cover is present between the detector elements of the detector substrate and the cover; the circuit substrate and the detector substrate are arranged such that at least one second stack cavity 15 of the stack that is bounded by the circuit substrate and the detector substrate is present between the detector substrate and the circuit substrate; and the first stack cavity and/or the second stack cavity are evacuated.

Figure 5:
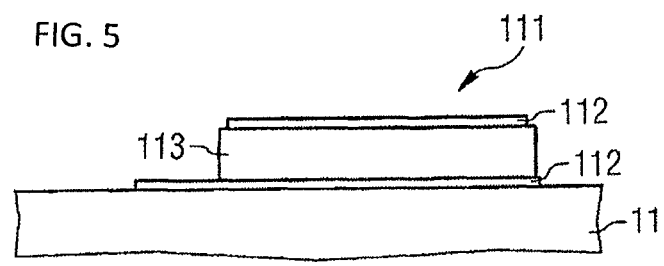
FIG. 5 shows the detector element on a detector substrate in a lateral cross section.
Figure 6:
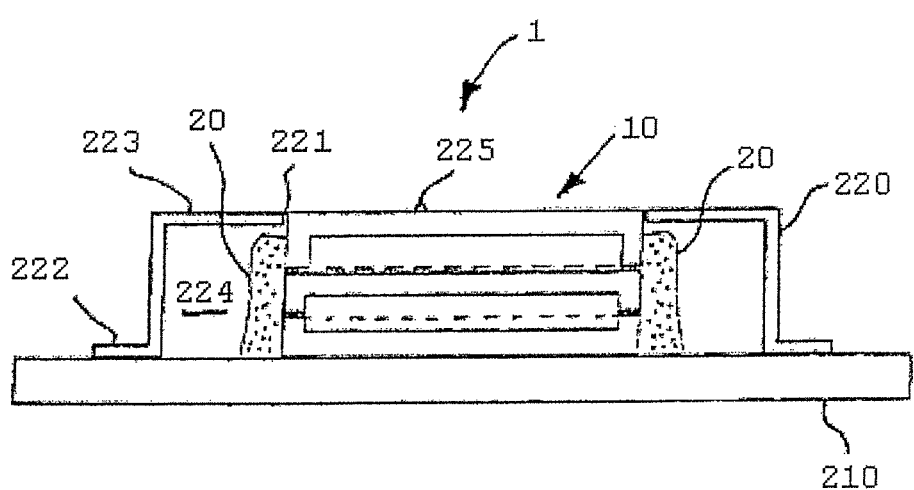
FIG. 6 shows a device according to the invention for the detection of thermal radiation, in a lateral cross section.
Figure 7:
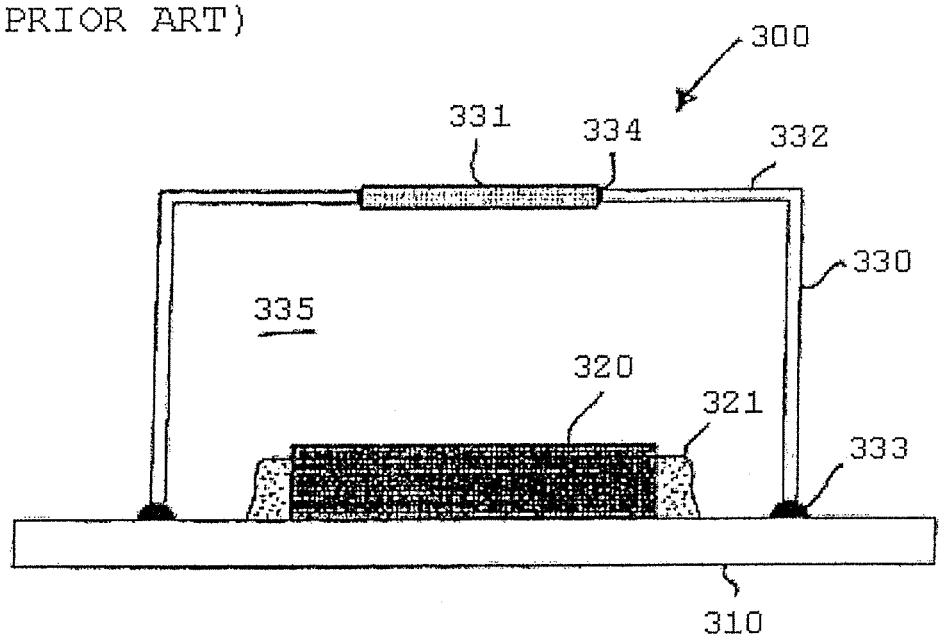
FIG. 7 shows a conventional device for the detection of thermal radiation in a lateral cross section.

The detector elements are pyroelectric detector elements in a thin film style with two electrode layers 112 and a pyroelectric layer 113 arranged between the electrode layers (FIG. 5). The pyroelectric layer is a layer approximately 1 pm in thickness, made of PZT as a pyroelectrically sensitive material. The electrode layers are made of platinum and a chromium-nickel alloy with layer thicknesses of approximately 20 nm.

The readout circuit possesses a readout element 122 (in the form of an ASIC) arranged on the circuit substrate. According to one embodiment (not shown), the readout element is integrated into the circuit substrate.

The detector substrate, the circuit substrate and the cover are respective silicon substrates. The detector elements are arranged within the second stack cavity, opposite a circuit substrate recess 124 of the circuit substrate. In the region of the circuit substrate recess, a common exposure window 17 is arranged through which the thermal radiation arrives at detector elements. The exposure ensues from the front side. According to an alternative embodiment (not shown), the exposure ensues from the back side. For this a suitable exposure window is respectively fashioned in the cover and the detector substrate.

A cover recess 131 is present in the cover 14. However, this cover recess can be omitted, as is indicated by the dashed line in FIG. 1.

Both the detector substrate and the cover and the detector substrate and the circuit substrate are connected permanently with one another by a hermetic adhesive bond 16. According to a first embodiment, the adhesive bond consists of a solder. The substrates (silicon substrates) are soldered with one another. As an alternative to this, the adhesive bond possesses an adhesive. The substrates are glued together.

An electrical wiring 123 of the detector elements is provided via the adhesive bond between the circuit substrate and the detector substrate. The electrical signals of the detector elements are read out via the wiring or via the readout circuit. As an alternative to this, the wiring ensues by means of "flip-chip".

During the manufacture of the adhesive bonds, vacuum is applied so that a negative pressure forms in the created stack cavities. The stack cavities are evacuated upon their formation. As an alternative to this, the stack cavities are evacuated after producing the adhesive bonds.

After the manufacture of the stack, the stack is provided with a casing 20. For this an unlinked plastic is applied to the stack in an injection molding method and is subsequently cross-linked. As an alternative to this, a molding process is implemented. It is thereby ensured that the exposure window of the cover remains free (i.e. is not covered).

To produce the stack, the detector substrate with the detector array, the circuit substrate with the readout circuit and the cover are provided and permanently connected with one another as described. The production thereby ensues at the wafer level. For this silicon wafers are provided with a plurality of corresponding functionalities (detector arrays, readout circuits, cover recesses). Detector substrate, circuit substrate and cover are provided at the wafer level. These functionalized silicon wafers are permanently connected with one another as described above. A wafer stack with a plurality of individual stacks is produced. After the connection, the individual stacks are individualized by sawing the wafer stack and are respectively provided with a casing.

The device is used in a movement sensor or presence sensor. A plurality of stacks or, respectively, devices with one stack respectively is provided for application in a thermal imaging camera.

Although modifications and changes may be suggested by those skilled in the art, it is the intention of the inventor to embody within the patent warranted heron all changes and modifications as reasonably and properly come within the scope of his contribution to the art.

The invention claimed is:

1. A device for detecting thermal radiation, comprising:
a substrate;
a protective housing attached to the substrate and formed of an electrically conductive material, said protective housing having a top side facing away from said substrate, said top side having an opening therein;
a stack mounted on the substrate within the protective housing, said stack comprising at least one detector substrate with at least one thermal detector element thereon that transduces thermal radiation into an electrical signal, at least one circuit substrate with at least one readout circuit that reads out the electrical signal, and at least one cover that covers the detector element; said detector substrate being arranged between the circuit substrate and the cover;
said detector substrate and said cover being arranged on one another in such a way that at least one first stack cavity of the stack that is defined by the detector substrate and the cover, exists between the detector element of the detector substrate and the cover;
said circuit substrate and said detector substrate being arranged such that at least one second stack cavity of the stack, that is defined by the circuit substrate and the detector substrate, exists between the detector substrate and the circuit substrate;
at least one of said first stack cavity and said second stack cavity being evacuated; and
said stack comprising a stack top side facing away from the substrate, said stack top side engaging said opening to make said stack top side accessible from an exterior of the protective housing,
wherein the at least one detector substrate and the at least one cover have substantially identical cross-sectional areas.

2. A device as claimed in claim 1 wherein at least one of said detector substrate, said circuit substrate and said cover has at least one exposure window therein with a transmission characteristic suitable for said thermal radiation for exposure of said detector element with said thermal radiation.

3. A device as claimed in claim 1 wherein at least one of said detector substrate, said circuit substrate and said cover comprises silicon.

4. A device as claimed in claim 1 wherein said detector element is arranged opposite a circuit substrate recess of said circuit substrate, or opposite a cover recess of said cover.

5. A device as claimed in claim 1 comprising at least one hermetic adhesive bond that permanently connects said detector substrate and said circuit substrate, or said detector substrate and said cover.

6. A device as claimed in claim 5 wherein said adhesive bond is comprised of an electrically conductive substance.

7. A device as claimed in claim 1 comprises a plurality of thermal detector elements forming a detector array.

8. A device as claimed in claim 1 wherein said stack comprises a casing that fixes the stack on the substrate.

9. A device as claimed in claim 8 wherein said casing comprises a casting compound.

10. A device as claimed in claim 1 wherein said electrically conductive material of said protective housing comprises a metal.

11. A device as claimed in claim 1 wherein said opening has dimensions allowing said stack to be fitted into said opening.

12. A device as claimed in claim 1 wherein said top side of said protective housing terminates level with the stack top side.

13. A device as claimed in claim 1 wherein said protective housing comprises a base with which the protective housing is attached to the substrate.

14. A device as claimed in claim 1 wherein said protective housing is arranged at a distance from the stack to form a cavity inside said protective housing between the protective housing and the stack.

* * * * *